US008218807B1

(12) United States Patent
Johnson

(10) Patent No.: US 8,218,807 B1
(45) Date of Patent: Jul. 10, 2012

(54) PORTABLE MICROPHONE EXTENDER AND ASSOCIATED METHOD

(76) Inventor: Cass R. Johnson, Collinsville, IL (US)

( * ) Notice: Subject to any disclaimer, the term of this patent is extended or adjusted under 35 U.S.C. 154(b) by 1342 days.

(21) Appl. No.: 11/899,566

(22) Filed: Sep. 6, 2007

(51) Int. Cl.
*H01L 19/04* (2006.01)

(52) U.S. Cl. ........................................................ 381/361

(58) Field of Classification Search ................... 381/361
See application file for complete search history.

(56) References Cited

U.S. PATENT DOCUMENTS

| | | | | |
|---|---|---|---|---|
| D305,026 | S * | 12/1989 | Wolf | D14/229 |
| 5,893,541 | A | 4/1999 | Michaelson | |
| D413,602 | S | 9/1999 | Chen | |
| 6,316,706 | B1 | 11/2001 | Sammons | |
| 6,333,984 | B1 | 12/2001 | Yang | |
| 6,424,723 | B1 * | 7/2002 | Jing | 381/361 |
| 6,757,401 | B2 | 6/2004 | Uchimura et al. | |
| 2002/0168078 | A1 * | 11/2002 | Kuerti et al. | 381/361 |
| 2002/0168079 | A1 * | 11/2002 | Kuerti et al. | 381/361 |
| 2004/0052395 | A1 * | 3/2004 | Sin | 381/361 |

* cited by examiner

*Primary Examiner* — Thao Le
(74) *Attorney, Agent, or Firm* — Montgomery Patent & Design, LLC; Robert C. Montgomery; Joseph T. Yaksich

(57) ABSTRACT

An apparatus that allows a standard straight microphone stand to be used as a boom-style microphone stand is herein disclosed comprising an extender having a tapered cylindrical section that essentially converts the standard straight microphone stand to a boom-type stand. In use, a person would insert the standard microphone into the tapered cylindrical extender while routing the microphone cable through the slot running the length of the cylinder. Next, the small tapered end is then secured to a standard microphone stand using a friction fit to keep it in place. The device therefore provides a useable microphone extension without the possibility of tipping the stand over. The device is to be provided in various lengths suitable to various microphone applications.

12 Claims, 2 Drawing Sheets

PORTABLE MICROPHONE EXTENDER AND ASSOCIATED METHOD

RELATED APPLICATIONS

There are no previously filed, nor currently any co-pending applications based on the present invention, anywhere in the world.

FIELD OF THE INVENTION

This invention relates to musical accessories and, more particularly, to a portable microphone extender for adapting an existing microphone stand to a boom-style microphone stand.

BACKGROUND OF THE INVENTION

A "boom-style" microphone stand often provides many benefits over its conventional and more common "straight-style" sibling. The boom stand places the stand further back from the performer and allows just the microphone to project inward. This is a big plus for those who may be singing or speaking, as one does not have to "lean into" the microphone. It is almost a requirement for those who are playing an instrument such as a guitar, as the microphone stand is placed away from the performer and room for the instrument is provided. However, boom style stands are not as readily available as straight style stands due to their cost. Additionally, the base is a larger and heavier to counteract the top-heavy nature of the boom style stand. This places many speakers or performers at a disadvantage, especially when using stands and associated electronic equipment that belongs to others or is rented for one time use.

Several attempts have been made in the past to provide an apparatus for effectively adapting an existing microphone stand to a boom-style microphone stand. U.S. Pat. No. 5,893,541 in the name of Michaelson discloses a spring loaded or mechanically activated detent for a microphone stand that allows for quick disassembly and re-assembly. The microphone main shaft is terminated at the lower end with a circumferential raceway or slot. The base has a coaxial matching cavity that accepts the lower end of the microphone shaft. At a depth to match the raceway, a spring loaded ram, positioned radially, extends into and mates with the raceway to secure the shaft to the base. In another preferred embodiment a spring clip or a stiff clip can be mechanically inserted through a radially extended opening in the base to engage the slot in the lower end of the shaft. There may be other such rams distributed around the circumference of the shaft. In another preferred embodiment the raceway may extend only partially around the circumference of the shaft. The raceway will be of a uniform depth for some arc length ending with a lip and a ramp up to the surface. This arrangement allows the shaft to be twisted, overcoming the lip against the spring force, and then twisted farther to free the shaft from the base. The invention is arranged to refit existing microphone stands. A plug is threaded into the lower end of the shaft, or microphone pole, and may be secured with a set screw. This plug has a shaft extending from the bottom that has at least one circumferential raceway. A tapped receptacle is screwed into the base. The receptacle has a coaxial cavity that accepts and mates with the second shaft. The receptacle has a spring loaded ram or a spring of stiff clip that is radially positioned and retained in the receptacle. The ram or the clips extend into the raceway to secure the main microphone shaft to the base. Unfortunately, this prior art example does not include an opening for easy routing of cords.

U.S. Pat. No. 6,316,706 in the name of Sammons discloses a multi-purpose entertainer stand comprised of a central mast and a base. The base has a hub and a plurality of legs pivotally attached to the hub for supporting the stand. The hub is connected to the central mast. A main body is connected to the central mast and is vertically adjustable along the central mast. A pivot body is pivotally attached to the main body for supporting a microphone, and the microphone is vertically adjustable by rotating the pivot body relative to the main body. A music easel is pivotally attached to the central mast for displaying sheet music. Preferably the hub and music easel are also vertically adjustable along the central mast. Unfortunately, this prior art example is not designed for attachment to a microphone clip.

U.S. Pat. No. 6,333,984 in the name of Yang describes a clip-type microphone comprised of a main rod, a first clip set fastened with the main rod, a second clip set fastened with the main rod, an extension rod fastened with one end of the main rod, and a head fastened with one end of the extension rod. The head of the microphone is located in proximity of the mouth of a user of the microphone. The main rod is fastened to the garment of the user of the microphone such that the clip sets hold a specific part of the garment of the microphone user. Unfortunately, this prior art example does not include an opening for easy routing of cords.

None of the prior art particularly describes a portable microphone extender for adapting an existing microphone stand to a boom-style microphone stand. Accordingly, there exists a need for a means by which the benefits of a boom-style microphone stand can be provided with a straight style microphone stand in a quick and easy manner. The present invention satisfies such a need by providing an apparatus that is convenient and easy to use, lightweight yet durable in design, and adapts an existing microphone stand to a boom-style microphone stand. The portable microphone extender attaches easily to a microphone clip with a secure friction fit. The apparatus does not affect stand stability and includes an opening for easy routing of cords, making it ideal for performers who play instruments. The present invention is simple to use, inexpensive, and designed for many years of repeated use.

SUMMARY OF THE INVENTION

In view of the foregoing disadvantages inherent in the prior art, it has been observed that there is need for a portable microphone extender for adapting an existing microphone stand to a boom-style microphone stand.

The present invention is an apparatus that allows a conventional straight microphone stand to be used as a "boom" microphone stand. Upon initial observation of a straight microphone stand and a microphone using the invention, nothing appears readily different. However, after closer inspection, it can be seen that the microphone is held outward from the conventional microphone clip approximately six (6) to eight (8) inches than normally would be expected. This extension is provided by a cylindrical section of plastic that essentially converts the standard straight microphone stand to a boom-type stand. To use the invention, the user would insert the standard microphone into the tapered cylindrical invention while routing the microphone cable through the slot running the length of the cylinder. Next, the small end of the tapered invention is then placed securely in the conventional microphone stand using a friction fit to keep it in place. The invention is approximately eight (8) inches long, and as such provides a welcome and useable microphone extension, but without the worry of tipping the stand over. The use of the apparaqtus provides the conveniences of a boom microphone stand at almost anytime, anywhere in a simple, compact and easy to store manner.

A portable microphone extending apparatus includes a portable hollow body with axially opposed male and female appendages that are open and in fluid communication with a longitudinal length of the body. Such a body has a non-uniform diameter extending along the longitudinal length thereof, and such male and female appendages are tapered and thereby have first and second adaptable diameters. Such first and second adaptable diameters are uniquely sized at equilibrium wherein the male appendage is suitably sized and shaped to slidingly fit into an existing microphone stand clip. The female appendage is suitably sized and shaped to receive an existing microphone housing, and the body has a unitary and single shape.

The apparatus further includes a plurality of pick holders directly attached to an exterior surface of the body and juxtaposed proximate to the female appendage. Such pick holders are located along diametrically opposing sides of the body such that a guitar player can quickly acquire a spare pick using either hand. Each of the pick holders includes an integrally molded three-sided pocket shaped enclosure sized to loosely hold at least one existing spare pick. The pick holders are located along opposite sides of the body and are equidistantly spaced from the slot. Each of the pick holders further is provided with arcuately shaped top surfaces for allowing easy access to the existing picks.

The apparatus further includes a rectilinear slot extending along the entire longitudinal length of the body. Such a slot is disposed above the pick holders and spaced therefrom, and has a wider opening at a proximal end of the body than a distal end of the body for facilitating an initial insertion of an existing microphone cord.

A method for adapting an existing microphone stand to a boom-style microphone stand includes the steps of: removing an existing microphone from the existing microphone stand; attaching a rectilinear and unitary body to the existing microphone stand; inserting a male appendage portion of the body into an existing microphone stand clip of the existing microphone stand; rotating a slot of the body to an upwardly facing orientation such that a plurality of pick holders are positioned at diametrically opposed sides of the slot; and attaching the existing microphone to the body by inserting and routing an existing microphone cord into the slot of the body and securely sliding an existing microphone housing into a female appendage portion of the body. The method further includes the step of: placing a desired number of existing spare picks into the pick holders.

BRIEF DESCRIPTION OF THE DRAWINGS

The advantages and features of the present invention will become better understood with reference to the following more detailed description and claims taken in conjunction with the accompanying drawings, in which like elements are identified with like symbols, and in which:

| DESCRIPTIVE KEY |
|---|
| 10 portable microphone extender |
| 20 female appendage |
| 21 body |
| 22 male appendage |
| 23 slot |
| 25 pick holder |
| 50 microphone |
| 51 microphone stand |
| 52 microphone stand clip |
| 53 pick |
| 54 microphone cord |

DETAILED DESCRIPTION OF THE PREFERRED EMBODIMENT

Figure 1:
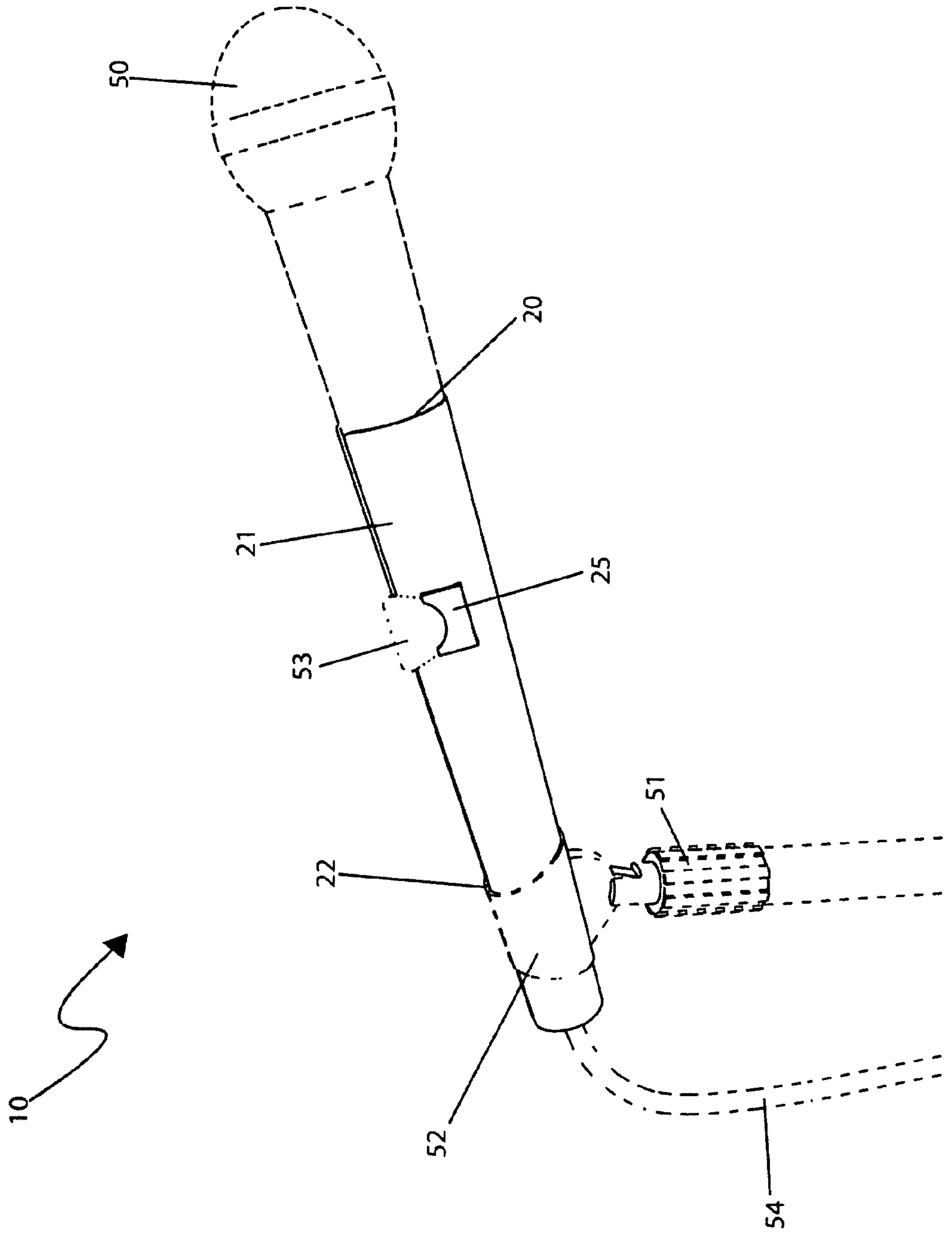
FIG. 1 is an environmental view of a portable microphone extender 10, according to a preferred embodiment of the present invention; and, FIG. 2 is a side perspective view of a portable microphone extender 10, according to a preferred embodiment of the present invention.
Figure 2:
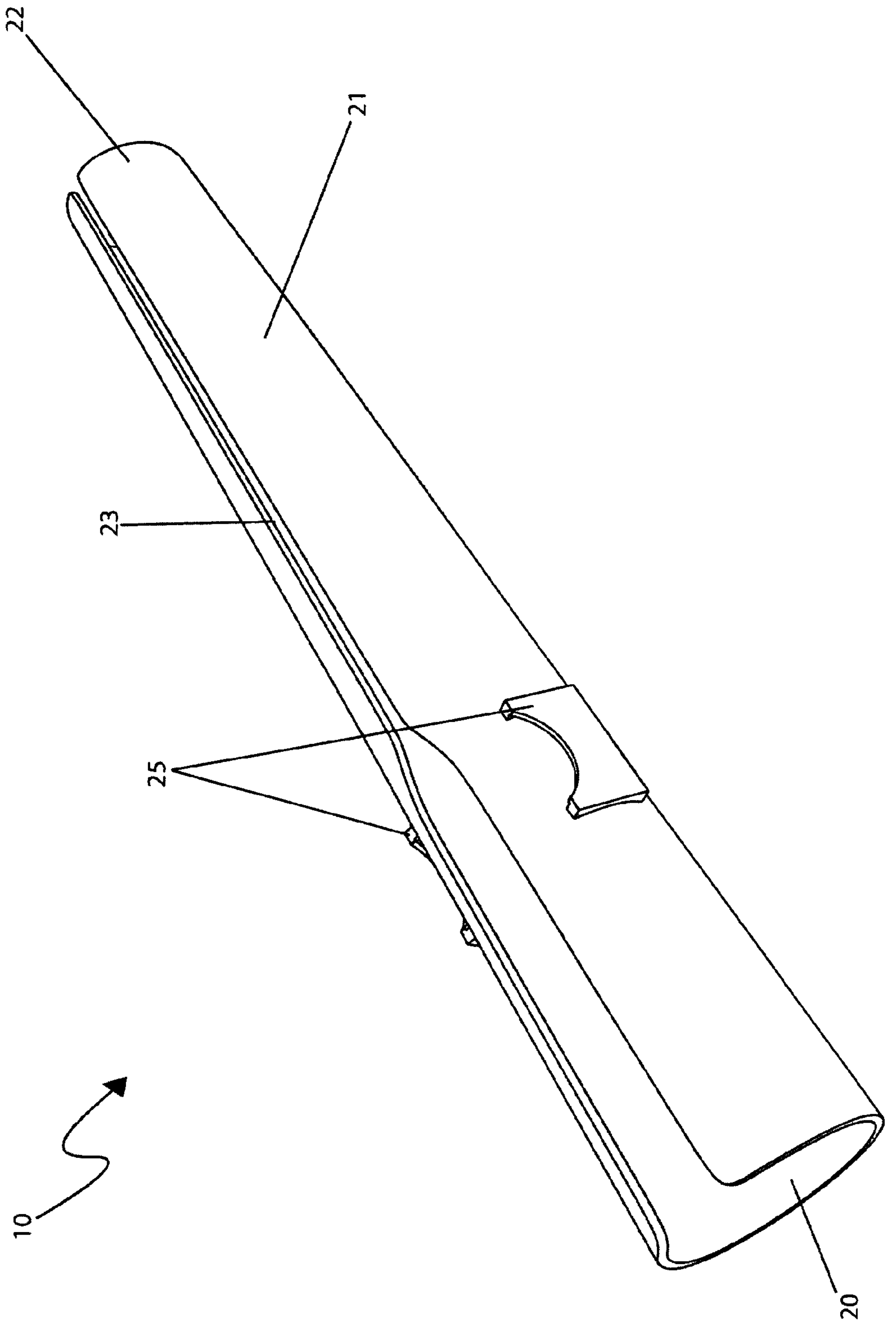

The best mode for carrying out the invention is presented in terms of its preferred embodiment, herein depicted within FIGS. 1 through 2. However, the invention is not limited to the described embodiment and a person skilled in the art will appreciate that many other embodiments of the invention are possible without deviating from the basic concept of the invention, and that any such work around will also fall under scope of this invention. It is envisioned that other styles and configurations of the present invention can be easily incorporated into the teachings of the present invention, and only one particular configuration shall be shown and described for purposes of clarity and disclosure and not by way of limitation of scope.

The terms "a" and "an" herein do not denote a limitation of quantity, but rather denote the presence of at least one of the referenced items.

The present invention describes a device and method for a portable microphone extender (herein described as the "device") 10, which provides a means to convert a standard straight microphone stand 51 to be used as a boom-style microphone stand. The device 10 comprises a cylindrical body section 21 which extends outward from a conventional microphone clip 52 terminating in a tapered opening 20 providing insertion of a typical microphone housing 50. The device 10 may be provided in various lengths being suitable to various applications.

Referring now to FIG. 1, an environmental view of the device 10, according to the preferred embodiment of the present invention, is disclosed. The device 10 comprises a female appendage 20, a male appendage 22, a body 21, and a pair of pick holders 25. The body 21 comprises a cylindrical shaped plastic adapting means approximately 1½ inches in diameter and comprises several lengths to suit various applications such as solo singing, group singing, public speaking, guitar playing, and the like. The body 21 comprises tapered end portions 20, 22, thereby providing an attachment means to a standard microphone stand clip 52 and a typical microphone body 50. The body 21 further provides a pair of integrally molded pick holders 25 located along opposing side surfaces providing a means for a guitar player to quickly acquire a spare pick 53 using either hand.

Referring now to FIG. 2, side perspective view of the device 10, according to the preferred embodiment of the present invention, is disclosed. The device 10 comprises a female appendage 20, a male appendage 22, a slot 23, and a pair of pick holders 25. The body 21 comprises a hollow cylindrical construction and is envisioned to be provided in several lengths ranging from approximately six (6) to fourteen (14) inches to suit various applications. The body 21 comprises proximal and a distal ends. The distal end of the body 21 provides a tapered male appendage 22 particularly sized to fit slidingly into a standard microphone stand clip 52. The proximal end of said body 21 provides a tapering female appendage 20 providing a tapered inside diameter particularly sized to receive a standard microphone housing 50.

The body 21 further comprises a slot 23 which runs in a linear direction the entire length of the body 21 allowing insertion and internal routing of a microphone cord 54 therein. The slot 23 is envisioned to provide a wider opening at the proximal end of the body 21, thereby facilitating an initial insertion of the microphone cord 54. The body 21 comprises a single-piece construction and is envisioned to be made using a durable plastic material such as polypropylene, acrylonitrile butadiene styrene (ABS), fiberglass filled plastic, or the like, being produced in an injection molding process common in the industry. The pick holders 25 each comprise integrally molded three-sided pocket shaped enclosure sized to loosely hold at least one spare pick 53. The pick holders 25 are located along opposite side surfaces of the body 21 being equidistant from the slot 23. The pick holders 25 additionally provide a rounded finger opening, thereby allowing easy access using one's finger to secure said picks 53.

It is envisioned that other styles and configurations of the present invention can be easily incorporated into the teachings of the present invention, and only one particular configuration shall be shown and described for purposes of clarity and disclosure and not by way of limitation of scope.

The preferred embodiment of the present invention can be utilized by the common user in a simple and effortless manner with little or no training. After initial purchase or acquisition of the device 10, it would be installed as indicated in FIG. 1.

The method of utilizing the device 10 may be achieved by performing the following steps: packing of the device 10 by a musician or public speaker along with other equipment needed for a performance; removing a microphone 50 from a microphone stand 51; installing the device 10 by inserting the male appendage portion 22 securely into the microphone stand clip 52 with the slot 23 at an upward facing orientation and the pick holders 25 positioned at side locations; replacing the microphone 50 by inserting and routing the microphone cord 54 into the slot 23 and securely sliding the microphone housing 50 into the female appendage portion 20 of the device 10; placing a desired number of spare picks 53 into the pick holders 25; engaging in a musical performance or public speaking activity; disassembling the device 10 from the microphone 50 and microphone stand 51; retaining the device 10 until needed again; and, enjoying an improved microphone position 50 in a convenient and portable manner while participating in musical or public speaking engagements using the present invention 10.

The foregoing descriptions of specific embodiments of the present invention have been presented for purposes of illustration and description. They are not intended to be exhaustive or to limit the invention and method of use to the precise forms disclosed. Obviously many modifications and variations are possible in light of the above teaching. The embodiment was chosen and described in order to best explain the principles of the invention and its practical application, and to thereby enable others skilled in the art to best utilize the invention and various embodiments with various modifications as are suited to the particular use contemplated. It is understood that various omissions or substitutions of equivalents are contemplated as circumstance may suggest or render expedient, but is intended to cover the application or implementation without departing from the spirit or scope of the claims of the present invention.

What is claimed is:

1. A portable microphone extending apparatus for adapting an existing microphone stand to a boom-style microphone stand, said microphone extending apparatus comprising:

- a hollow body having axially opposed male and female appendages that are open and in fluid communication with a longitudinal length of said body;
- a plurality of pick holders directly attached to an exterior surface of said body and juxtaposed proximate to said female appendage; and,
- a rectilinear slot extending along the entire longitudinal length of said body, said slot being disposed above said pick holders and spaced therefrom;
- wherein said male and female appendages are tapered and thereby have first and second adaptable diameters, said first and second adaptable diameters being uniquely sized at equilibrium;
- wherein each of said pick holders comprises an integrally molded three-sided pocket shaped enclosure sized to loosely hold at least one existing spare pick;
- wherein said pick holders are located along opposite sides of said body and equidistantly spaced from said slot; and,
- wherein each of said pick holders are provided with arcuately shaped top surfaces for allowing easy access to the existing picks.

2. The microphone extending apparatus of claim 1, wherein said pick holders are located along diametrically opposing sides of said body such that a guitar player can quickly acquire a spare pick using either hand.

3. The microphone extending apparatus of claim 1, wherein said male appendage is suitably sized and shaped to slidingly fit into an existing microphone stand clip, wherein said female appendage is suitably sized and shaped to receive an existing microphone housing.

4. The microphone extending apparatus of claim 1, wherein said slot has a wider opening at a proximal end of the body than a distal end of said body for facilitating an initial insertion of an existing microphone cord.

5. The microphone extending apparatus of claim 1, wherein said body has a unitary and single shape.

6. A portable microphone extending apparatus for adapting an existing microphone stand to a boom-style microphone stand, said microphone extending apparatus comprising:

- a portable hollow body having axially opposed male and female appendages that are open and in fluid communication with a longitudinal length of said body, said body having a non-uniform diameter extending along the longitudinal length thereof;
- a plurality of pick holders directly attached to an exterior surface of said body and juxtaposed proximate to said female appendage; and,
- a rectilinear slot extending along the entire longitudinal length of said body, said slot being disposed above said pick holders and spaced therefrom;
- wherein said male and female appendages are tapered and thereby have first and second adaptable diameters, said first and second adaptable diameters being uniquely sized at equilibrium;
- wherein each of said pick holders comprises an integrally molded three-sided pocket shaped enclosure sized to loosely hold at least one existing spare pick;
- wherein said pick holders are located along opposite sides of said body and equidistantly spaced from said slot; and, wherein each of said pick holders are provided with arcuately shaped top surfaces for allowing easy access to the existing picks.

7. The microphone extending apparatus of claim 6, wherein said pick holders are located along diametrically opposing sides of said body such that a guitar player can quickly acquire a spare pick using either hand.

8. The microphone extending apparatus of claim 6, wherein said male appendage is suitably sized and shaped to slidingly fit into an existing microphone stand clip, wherein said female appendage is suitably sized and shaped to receive an existing microphone housing.

9. The microphone extending apparatus of claim 6, wherein said slot has a wider opening at a proximal end of the body than a distal end of said body for facilitating an initial insertion of an existing microphone cord.

10. The microphone extending apparatus of claim 6, wherein said body has a unitary and single shape.

11. A method for adapting an existing microphone stand to a boom-style microphone stand, said method comprising the steps of:

a. removing an existing microphone from the existing microphone stand;

b. attaching a rectilinear and unitary body to the existing microphone stand;

c. inserting a male appendage portion of said body into an existing microphone stand clip of the existing microphone stand;

d. rotating a slot of said body to an upwardly facing orientation such that a plurality of pick holders are positioned at diametrically opposed sides of said slot; and, e. attaching the existing microphone to said body by inserting and routing an existing microphone cord into the slot of said body and securely sliding an existing microphone housing into a female appendage portion of said body.

12. The method of claim 11, further comprising the step of:

f. placing a desired number of existing spare picks into said pick holders.

* * * * *